(12) United States Patent
Iwata

(10) Patent No.: US 11,114,740 B2
(45) Date of Patent: Sep. 7, 2021

(54) COUPLING MECHANISM, COUPLING MECHANISM GROUP, AND ANTENNA DEVICE

(71) Applicant: FUJIKURA LTD., Tokyo (JP)

(72) Inventor: Koichiro Iwata, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 16/645,565

(22) PCT Filed: Jul. 6, 2018

(86) PCT No.: PCT/JP2018/025678
§ 371 (c)(1),
(2) Date: Mar. 9, 2020

(87) PCT Pub. No.: WO2019/058709
PCT Pub. Date: Mar. 28, 2019

(65) Prior Publication Data
US 2020/0280119 A1 Sep. 3, 2020

(30) Foreign Application Priority Data
Sep. 22, 2017 (JP) .............................. JP2017-182771

(51) Int. Cl.
*H01Q 1/02* (2006.01)
*H01L 23/40* (2006.01)
(Continued)

(52) U.S. Cl.
CPC .......... *H01Q 1/02* (2013.01); *H01L 23/4006* (2013.01); *H01L 23/66* (2013.01); *H01Q 1/2283* (2013.01);
(Continued)

(58) Field of Classification Search
CPC .......... H01Q 1/02; H01Q 1/2283; H01Q 1/12; H01Q 1/1207; H01Q 3/04; H01L 23/4006;
(Continued)

(56) References Cited

U.S. PATENT DOCUMENTS 6,138,748 A    10/2000 Hamburgen et al.
2002/0148596 A1  10/2002 Werninger
(Continued)

FOREIGN PATENT DOCUMENTS

CN    201731799 U    2/2011
DE        1260567 B    2/1968
(Continued)

OTHER PUBLICATIONS

Written Opinion dated Mar. 24, 2020, issued in counterpart application No. PCT/JP2018/025678, with English translation. (8 pages).
(Continued)

*Primary Examiner* — Robert Karacsony
(74) *Attorney, Agent, or Firm* — Westerman, Hattori, Daniels & Adrian, LLP

(57) ABSTRACT

The present invention achieves a coupling mechanism which allows for more efficient dissipation of heat generated by the heat generating element, as compared with a conventional coupling mechanism. A coupling mechanism (1) includes: a plate-like member group (11) including (i) a first plate-like member (11_2) which is joined to a heat generating element (92) and (ii) a second plate-like member (11_1) which is joined to a radiator (91); and a shaft member (12) configured to hold the first plate-like member and the second plate-like member (11_1, 11_2) so as to allow the first plate-like member and the second plate-like member (11_1, 11_2) to rotate on a shared axis which is orthogonal to main surfaces of the respective first and second plate-like members (11_1,
(Continued)

11_2). The main surface of the first plate-like member (11_2) is in plane contact with the main surface of the second plate-like member (11_1).

11 Claims, 5 Drawing Sheets

(51) Int. Cl.
| | |
|---|---|
| *H01L 23/66* | (2006.01) |
| *H01Q 1/22* | (2006.01) |
| *H01Q 3/04* | (2006.01) |
| *H05K 7/20* | (2006.01) |

(52) U.S. Cl.
CPC ........... *H01Q 3/04* (2013.01); *H05K 7/20445* (2013.01); *H01L 2023/4087* (2013.01); *H01L 2223/6677* (2013.01)

(58) Field of Classification Search
CPC ................. H01L 23/66; H01L 2023/40; H01L 2023/4087; H01L 2223/6677; H01L 23/34; H01L 23/40; H01L 23/4093; H05K 7/20; H05K 7/20445; H05K 7/2039; H05K 7/20418; H05K 7/20454; H05K 7/20472; H05K 7/2049; H05K 7/20509; G06F 1/20; G06F 1/203; G06F 1/206; F28F 2275/14; F28F 2275/143; F28F 2275/146; F28F 2275/16; F28F 2280/10; F28F 2280/105

See application file for complete search history.

(56) References Cited

U.S. PATENT DOCUMENTS

| | | |
|---|---|---|
| 2014/0049435 A1 | 2/2014 | Brown |
| 2016/0380350 A1 | 12/2016 | Elson et al. |

FOREIGN PATENT DOCUMENTS

| | | |
|---|---|---|
| FR | 2618262 A1 | 1/1989 |
| JP | H07-312501 A | 11/1995 |
| JP | 2000-068738 A | 3/2000 |
| WO | 2007/031926 A2 | 3/2007 |

OTHER PUBLICATIONS

International Search Report dated Sep. 18, 2018, issued in counterpart application No. PCT/JP2018/025678, with English translation. (2 pages).

COUPLING MECHANISM, COUPLING MECHANISM GROUP, AND ANTENNA DEVICE

TECHNICAL FIELD

The present invention relates to a coupling mechanism or a coupling mechanism group configured to couple a heat generating element and a radiator together. The present invention also relates to an antenna device including such a coupling mechanism or such a coupling mechanism group.

BACKGROUND ART

An antenna device configured to include an antenna substrate is widely employed. With the configuration, an orientation of the antenna substrate can need to be changed in accordance with, for example, an electromagnetic environment of a location in which the antenna device is provided.

Patent Literature 1 discloses a technique for coupling an antenna substrate to a housing via a hinge. Such a technique allows an orientation of an antenna substrate to be controlled in accordance with, for example, an electromagnetic environment of a location where an antenna device is provided.

CITATION LIST

Patent Literature

[Patent Literature 1]
Japanese Patent Application Publication Tokukai No. 2000-68738

SUMMARY OF INVENTION

Technical Problem

Note, however, that in a case where the antenna substrate is coupled to the housing in accordance with the technique disclosed in Patent Literature 1, it is unfortunately difficult to efficiently dissipate heat generated in the antenna substrate. This is because the hinge has a high thermal resistance (i.e., has less thermal conductivity). Via the hinge, the antenna substrate, which serves as a heat generating element, is coupled to the housing which serves as a radiator. Note that such a problem can occur not only in a coupling mechanism configured to couple an antenna substrate to a housing, but also in a coupling mechanism as a whole for coupling a heat generating element to a radiator.

The present invention has been made in view of the problems, and an object of the present invention is to achieve a coupling mechanism configured to couple a heat generating element and a radiator together so as to allow for more efficient dissipation of heat generated by the heat generating element, as compared with a conventional coupling mechanism.

Solution to Problem

In order to attain the object, a coupling mechanism in accordance with an aspect of the present invention includes: a plate-like member group including (i) a first plate-like member which is joined to a heat generating element and (ii) a second plate-like member which is joined to a radiator; and a shaft member configured to hold the first plate-like member and the second plate-like member so as to allow the first plate-like member and the second plate-like member to rotate on a shared axis which is orthogonal to main surfaces of the respective first and second plate-like members, while causing a partial region of the main surface of the first plate-like member to be in plane contact with a partial region of the main surface of the second plate-like member.

Advantageous Effects of Invention

An aspect of the present invention makes it possible to achieve a coupling mechanism which allows for more efficient dissipation of heat generated by a heat generating element, as compared with a conventional coupling mechanism.

DESCRIPTION OF EMBODIMENTS

First Embodiment of Coupling Mechanism (Configuration of Coupling Mechanism)

Figure 1:
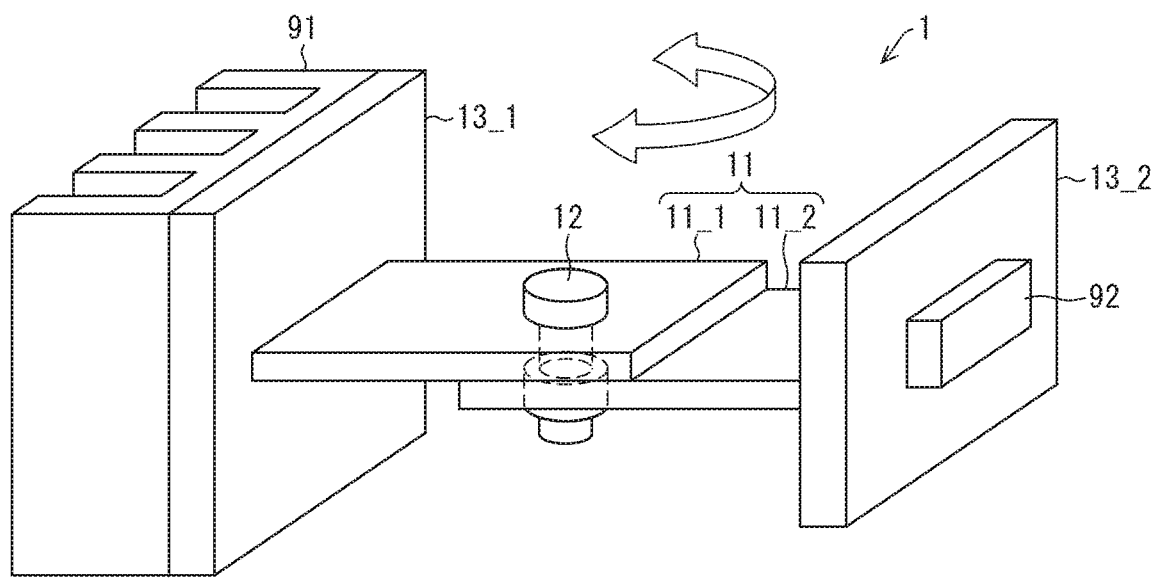
FIG. 1 is a perspective view illustrating a first embodiment of a coupling mechanism in accordance with the present invention.

A first embodiment of a coupling mechanism in accordance with the present invention is described below with reference to FIG. 1. FIG. 1 is a perspective view illustrating how a coupling mechanism 1 is configured in accordance with the first embodiment.

The coupling mechanism 1 is configured to couple a radiator 91 and a heat generating element 92 together. As illustrated in FIG. 1, the coupling mechanism 1 is configured to include a plate-like member group 11, a shaft member 12, and first and second supports 13_1 and 13_2. The radiator 91 is provided so as to dissipate heat, and is not limited to such a specific one. Examples of the radiator 91 include a heat sink. The heat generating element 92 is provided so as to generate heat, and is not limited to such a specific one. Examples of the heat generating element 92 include an antenna substrate.

According to the first embodiment, the plate-like member group 11 is constituted by first and second plate-like members 11_1 and 11_2. The first plate-like member 11_1 is joined to the radiator 91 via the first support 13_1. The first plate-like member 11_1 and the first support 13_1 are each made of a thermally conductive material. This causes the first plate-like member 11_1 to be in thermal contact with the radiator 91 via the first support 13_1. The second plate-like member 11_2 is joined to the heat generating element 92 via the second support 13_2. The second plate-like member 11_2 and the second support 13_2 are each made of a thermally conductive material. This causes the second plate-like member 11_2 to be in thermal contact with the heat generating element 92 via the second support 13_2. The plate-like members 11_1 and 11_2 and the supports 13_1 and 13_2 are each suitably made of, for example, aluminum, an aluminum alloy, copper, or a copper alloy.

Note that a publicly known joining method which does not impair thermal conductivity can be appropriately employed as each of the following methods (1) through (4): (1) a method of joining the first plate-like member 11_1 and the first support 13_1 together; (2) a method of joining the first support 13_1 and the radiator 91 together; (3) a method of joining the second plate-like member 11_2 and the second support 13_2 together; and (4) a method of joining the second support 13_2 and the heat generating element 92 together. Examples of a suitable joining method include welding, soldering, brazing, and mechanical joining.

The first plate-like member 11_1 and the second plate-like member 11_2 are provided so that a partial region of a back surface of the first plate-like member 11_1 is in plane contact with a partial region of a front surface of the second plate-like member 11_2. For example, heat radiating grease can be applied to (i) the back surface of the first plate-like member 11_1 and (ii) the front surface of the second plate-like member 11_2. That is, the back surface of the first plate-like member 11_1 and the front surface of the second plate-like member 11_2 can be in direct plane contact with each other or can be in indirect plane contact with each other via, for example, heat radiating grease.

Note that two surfaces which (i) are included in six surfaces constituting a surface of a plate-like member and (ii) have a largest area are herein referred to as "main surfaces". In a case where it is necessary to distinguish between the two main surfaces, one of the two main surfaces is referred to as a "front surface", and the other one of the two main surfaces is referred to as a "back surface". Note here that the two plate-like members 11_1 and 11_2 each have (i) a first main surface which is located on an upper side in FIG. 1 and referred to as a front surface and (ii) a second main surface which is located on a lower side in FIG. 1 and referred to as a back surface.

The shaft member 12 holds the plate-like members 11_1 and 11_2 so as to allow the plate-like members 11_1 and 11_2 to rotate on a shared axis which is orthogonal to each of main surfaces of the respective plate-like members 11_1 and 11_2, while causing the partial region of the back surface of the first plate-like member 11_1 to be in plane contact with the partial region of the front surface of the second plate-like member 11_2. In the first embodiment, a bolt is employed as the shaft member 12. The bolt fastens the plate-like members 11_1 and 11_2. The bolt has a head part which presses the first plate-like member 11_1 toward the second plate-like member 11_2. Details and an effect, brought about by the method in which the plate-like members 11_1 and 11_2 are fastened together with use of a bolt, will be described later with reference to another drawing different from FIG. 1.

With the configuration of the coupling mechanism 1, heat caused by the heat generating element 92 is transferred to the second plate-like member 11_2 via the second support 13_2. The heat, which has been transferred to the second plate-like member 11_2, is then transferred to the first plate-like member 11_1 via a region in which the second plate-like member 11_2 is in plane contact with the first plate-like member 11_1. The heat, which has been transferred to the plate-like member 11_1, is subsequently transferred to the radiator 91 via the first support 13_1. The heat, which has been transferred to the radiator 91, is then dissipated into, for example, ambient air. Note that the second plate-like member 11_2 is in plane contact with the first plate-like member 11_1. With the configuration, a thermal resistance of the coupling mechanism 1, which is located between the heat generating element 92 and the radiator 91, can be further reduced as compared with a configuration in which the second plate-like member 11_2 is in point contact or in line contact with the first plate-like member 11_1. As such, heat generated by the heat generating element 92 can be more efficiently dissipated, as compared with a case where the second plate-like member 11_2 is in point contact or in line contact with the first plate-like member 11_1.

(Method of Fastening Plate-Like Members Together with Use of Bolt)

Figure 2:
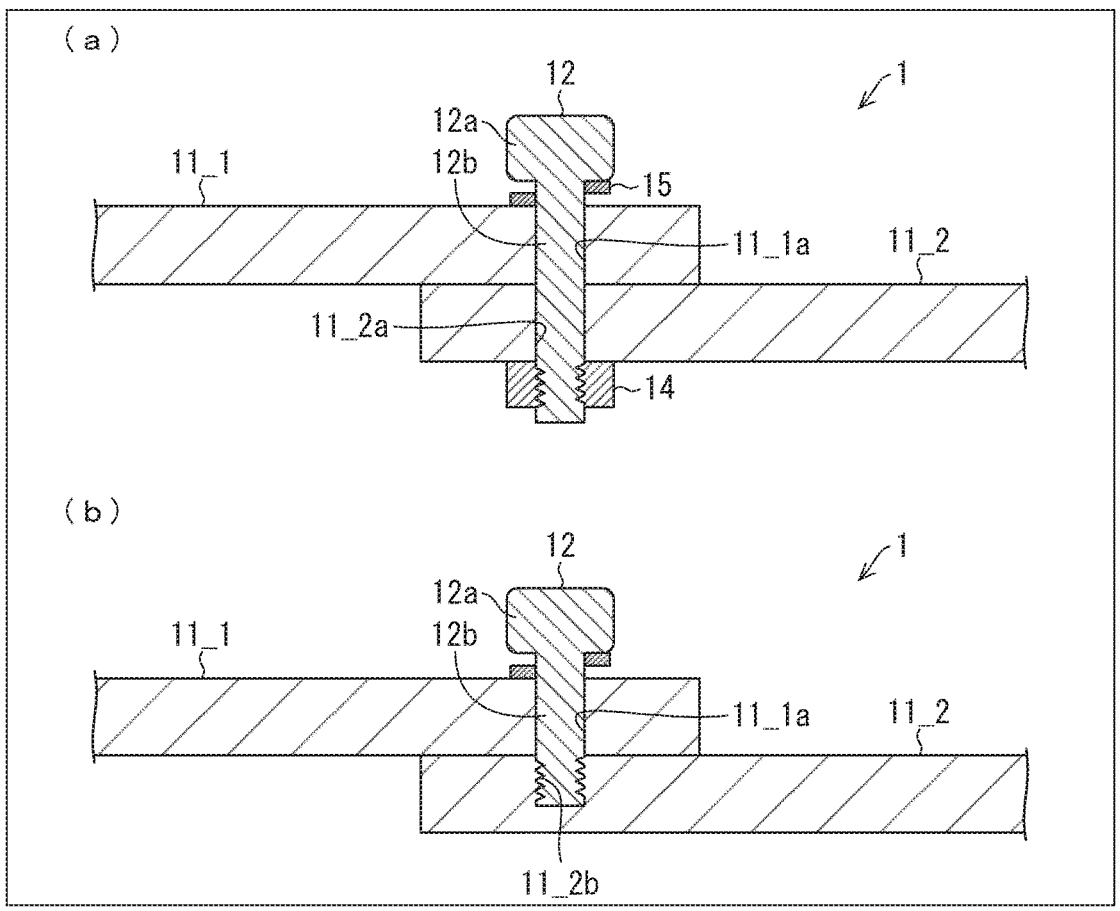
FIG. 2 is a cross-sectional view of the coupling mechanism illustrated in FIG. 1. (a) of FIG. 2 illustrates a case where a first fastening method is employed. (b) of FIG. 2 illustrates a case where a second fastening method is employed.

The following description discusses, with reference to FIG. 2, a method of fastening the plate-like members 11_1 and 11_2 together with use of a bolt. Note that the shaft member 12 is also referred to as a bolt 12 in the present section.

(a) of FIG. 2 is a cross-sectional view of the coupling mechanism 1 around the shaft member 12 and illustrates a first fastening method of fastening the plate-like members 11_1 and 11_2 together with use of the bolt 12.

In a case where the first fastening method is applied, (i) a first through hole 11_1a, which extends from a front surface of the first plate-like member 11_1 toward the back surface of the first plate-like member 11_1, is formed in the first plate-like member 11_1 and (ii) a second through hole 11_2a is formed in the second plate-like member 11_2. The second through hole 11_2a extends from the front surface of the second plate-like member 11_2 to a back surface of the second plate-like member 11_2, Then, the first plate-like member 11_1 and the second plate-like member 11_2 are provided so that the first through hole 11_1a and the second through hole 11_2a communicate with each other. Subsequently, the bolt 12 is put in the first through hole 11_1a, from the front surface side of the first plate-like member 11_1, so as to pass through the first through hole 11_1a and the second through hole 11_2a. Thereafter, a tip of a shaft part 12b of the bolt 12 is screwed into a nut 14 which is provided on the back surface side of the second plate-like member 11_2. This completes fastening of the plate-like members 11_1 and 11_2.

(b) of FIG. 2 is a cross-sectional view of the coupling mechanism 1 around the shaft member 12 and illustrates a second fastening method of fastening the plate-like members 11_1 and 11_2 together with use of the bolt 12.

In a case where the second fastening method is applied, (i) a through hole 11_1a, which extends from the front surface of the first plate-like member 11_1 toward the back surface of the first plate-like member 11_1, is formed in the first plate-like member 11_1 and (ii) a screw hole 11_2b is formed in the second plate-like member 11_2. Note that the screw hole 11_2b can be (i) a through hole which extends from the front surface of the second plate-like member 11_2 toward the back surface of the second plate-like member 11_2 or (ii) a non-through-hole which extends from the front surface of the second plate-like member 11_2 toward an inner part of the second plate-like member 11_2 ((b) of FIG. 2 illustrates (ii) the non-through-hole). Then, the first plate-like member 11_1 and the second plate-like member 11_2 are provided so that the through hole 11_1a and the screw hole 11_2b communicate with each other. Subsequently, the bolt 12 is put in the through hole 11_1a, from the front surface side of the first plate-like member 11_1, so as to pass through the through hole 11_1a. Thereafter, the tip of the shaft part 12b of the bolt 12 is screwed into the screw hole 11_2b. This completes fastening of the plate-like members 11_1 and 11_2.

In each of the fastening methods described earlier, a head part 12a of the bolt 12 presses the first plate-like member 11_1 toward the second plate-like member 11_2. This allows the back surface of the first plate-like member 11_1 to be more reliably in plane contact with the front surface of the second plate-like member 11_2, even in a case where, for example, (1) the first plate-like member 11_1 or the second plate-like member 11_2 is slightly warped or (2) the back surface of the first plate-like member 11_1 or the front surface of the second plate-like member 11_2 is uneven to some extent. This allows a more reliable reduction in thermal resistance between the first plate-like member 11_1 and the second plate-like member 11_2. In general, each of the fastening methods described earlier is effective because it is often the case that a surface of a plate-like member is not an ideal mirror finished surface.

In (a) and (b) of FIG. 2, spring washers 15 (an elastic member recited in Claims), which have been elastically contracted, are sandwiched between the head part 12a of the shaft member 12 and the front surface of the first plate-like member 11_1. This causes the head part 12a of the shaft member 12 to press the first plate-like member 11_1 via the spring washers 15. It is therefore possible that the back surface of the first plate-like member 11_1 can be more stably in plane contact with the front surface of the second plate-like member 11_2. This ultimately allows a more stable reduction in thermal resistance between the first plate-like member 11_1 and the second plate-like member 11_2.

(a) and (b) of FIG. 2 each illustrate a first configuration in which the spring washers 15 are sandwiched between the head part 12a of the shaft member 12 and the front surface of the first plate-like member 11_1. Note, however, that a configuration in accordance with an aspect of the present invention is not limited to the first configuration. Specifically, a similar effect can also be brought about, in a case where a second configuration is employed in which the spring washers 15 are sandwiched between the back surface of the second plate-like member 11_2 and the nut 14. Alternatively, a similar effect can also be brought about, even in a case where the first configuration and the second configuration are used in combination. Moreover, a similar effect can also be brought about by using an elastic member other than the spring washers 15, instead of using the spring washers 15.

(Variation of Plate-Like Member)

According to the first embodiment, a plate-like member, which has a flat front surface and a flat back surface, is employed as each of the plate-like members 11_1 and 11_2. Note, however, that the plate-like members 11_1 and 11_2 are each not limited to such a plate-like member.

For example, irregularities, which are complementary to each other, can be provided in respective of (i) a region of the back surface of the first plate-like member 11_1 in which region the back surface of the first plate-like member 11_1 is in plane contact with the front surface of the second plate-like member 11_2 and (ii) a region of the front surface of the second plate-like member 11_2 in which region the front surface of the second plate-like member 11_2 is in plane contact with the back surface of the first plate-like member 11_1. Note, in this case, that the first plate-like member 11_1 and the second plate-like member 11_2 are provided so that irregularities, which are provided on the back surface of the first plate-like member 11_1, mesh with irregularities which are provided on the front surface of the second plate-like member 11_2. This causes an increase in area of a region in which the back surface of the first plate-like member 11_1 is in plane contact with the front surface of the second plate-like member 11_2. This ultimately causes a reduction in thermal resistance between the first plate-like member 11_1 and the second plate-like member 11_2.

Specific examples of such plate-like members 11_1 and 11_2 are described below with reference to FIG. 3.

Figure 3:
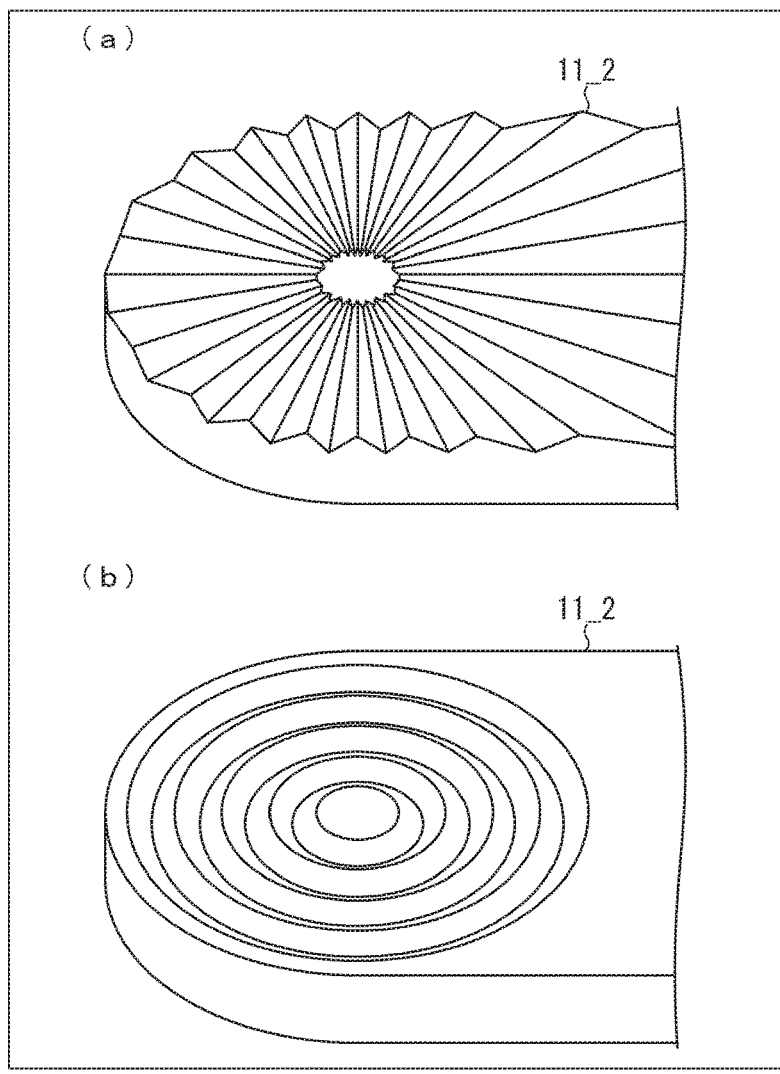
FIG. 3 is a perspective view illustrating a plate-like member of the coupling mechanism illustrated in FIG. 1. (a) of FIG. 3 illustrates a plate-like member in accordance with a first specific example. (b) of FIG. 3 illustrates a plate-like member in accordance with a second specific example.

(a) of FIG. 3 is a perspective view of the second plate-like member 11_2 in accordance with a first specific example. Irregularities having ridges are provided on the front surface of the second plate-like member 11_2 in accordance with the first specific example. The ridges radially extend from a place in the front surface of the second plate-like member 11_2 through which place the shaft member 12 passes (see (a) of FIG. 3). Note that an interval (angle) between the respective ridges which radially extend can be any interval (angle). On the back surface of the first plate-like member 11_1, the irregularities which are complementary to the irregularities which are provided on the front surface of the second plate-like member 11_2 are provided. This brings about (i) an effect of reducing a thermal resistance between the first plate-like member 11_1 and the second plate-like member 11_2 and (ii) an effect of allowing the second plate-like member 11_2 to gradually rotate with respect to the first plate-like member 11_1. Note here that the ridges of the irregularities are radially provided at regular intervals on each of the back surface of the first plate-like member 11_1 and the front surface of the second plate-like member 11_2 so that the irregularities which are provided on the back surface of the first plate-like member 11_1 and the irregularities which are provided on the front surface of the second plate-like member 11_2 are complementary to each other. This allows the second plate-like member 11_2 to rotate with respect to the first plate-like member 11_1 at predetermined intervals.

(b) of FIG. 3 is a perspective view of the second plate-like member 11_2 in accordance with a second specific example. Irregularities having ridges are provided on the front surface of the second plate-like member 11_2 in accordance with the second specific example. The ridges are concentrically provided around a place in the front surface of the second plate-like member 11_2 through which place the shaft member 12 passes (see (b) of FIG. 3). Note that an interval between the respective ridges which are concentrically provided can be any interval. On the back surface of the first plate-like member 11_1, the irregularities which are complementary to the irregularities which are provided on the front surface of the second plate-like member 11_2 are provided. With the configuration, the configuration illustrated in (b) of FIG. 3 (i) brings about an effect of reducing a thermal resistance between the first plate-like member 11_1 and the second plate-like member 11_2 as in the case of the configuration illustrated in (a) of FIG. 3 and (ii) brings about an effect of allowing more continuous rotation of the second plate-like member 11_2 with respect to the first plate-like member 11_1 as compared with the configuration illustrated in (a) of FIG. 3.

Note that (a) and (b) of FIG. 3 each illustrate an example in which the irregularities have a cross section which has a V shape. Note, however, that the irregularities can alternatively have a cross section which has a shape different from the V shape.

Second Embodiment of Coupling Mechanism (Configuration of Coupling Mechanism)

Figure 4:
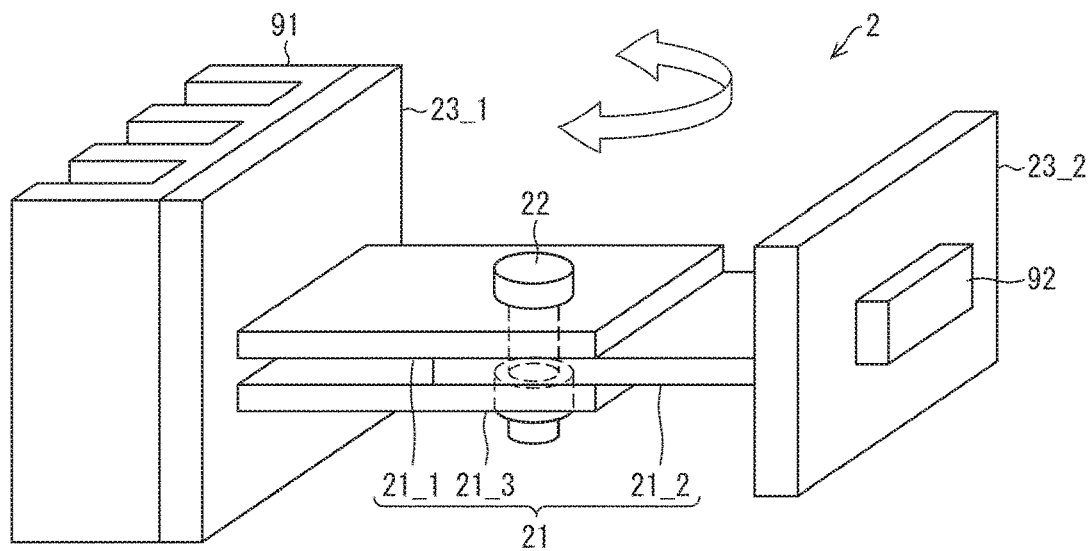
FIG. 4 is a perspective view illustrating a second embodiment of a coupling mechanism in accordance with the present invention.

A second embodiment of a coupling mechanism in accordance with the present invention is described below with reference to FIG. 4. FIG. 4 is a perspective view illustrating a configuration of a coupling mechanism 2 in accordance with the second embodiment.

The coupling mechanism 2 is a mechanism configured to couple a radiator 91 and a heat generating element 92 together. As illustrated in FIG. 4, the coupling mechanism 2 is configured to include a plate-like member group 21, a shaft member 22, and first and second supports 23_1 and 23_2.

According to the second embodiment, the plate-like member group 21 is constituted by first through third plate-like members 21_1 through 21_3. The first plate-like member 21_1 and the third plate-like member 21_3 are each joined to the radiator 91 via the first support 23_1. The first plate-like member 21_1, the third plate-like member 21_3, and the first support 23_1 are each made of a thermally conductive material. This causes each of the first plate-like member 21_1 and the third plate-like member 21_3 to be in thermal contact with the radiator 91 via the first support 23_1. The second plate-like member 21_2 is joined to the heat generating element 92 via the second support 23_2. The second plate-like member 21_2 and the second support 23_2 are each made of a thermally conductive material. This causes the second plate-like member 21_2 to be in thermal contact with the heat generating element 92 via the second support 23_2. The plate-like members 21_1 through 21_3 and the supports 23_1 and 23_2 are each suitably made of, for example, aluminum, an aluminum alloy, copper, or a copper alloy.

The three plate-like members 21_1 through 21_3 are provided so that the first plate-like member 21_1 and the third plate-like member 21_3 face each other across the second plate-like member 21_2. Note that a partial region of a back surface of the first plate-like member 21_1 is in plane contact with a partial region of a front surface of the second plate-like member 21_2. Similarly, a partial region of a back surface of the second plate-like member 21_2 is in plane contact with a partial region of a front surface of the third plate-like member 21_3. Note that the back surface of the first plate-like member 21_1 can be in direct plane contact with the front surface of the second plate-like member 21_2. Alternatively, the back surface of the first plate-like member 21_1 can be in indirect plane contact with the front surface of the second plate-like member 21_2 via, for example, heat radiating grease. Note also that the back surface of the second plate-like member 21_2 can be in direct plane contact with the front surface of the third plate-like member 21_3. Alternatively, the back surface of the second plate-like member 21_2 can be in indirect plane contact with the front surface of the third plate-like member 21_3 via, for example, heat radiating grease.

The shaft member 22 holds the plate-like members 21_1 through 21_3 so as to allow the plate-like members 21_1 through 21_3 to rotate on a shared axis which is orthogonal to main surfaces of the respective plate-like members 21_1 through 21_3, while (i) causing the partial region of the back surface of the first plate-like member 21_1 to be in plane contact with the partial region of the front surface of the second plate-like member 21_2 and (ii) causing the partial region of the back surface of the second plate-like member 21_2 to be in plane contact with the partial region of the front surface of the third plate-like member 21_3. In the second embodiment, a bolt is employed as the shaft member 22. The bolt fastens the plate-like members 21_1 through 21_3. The bolt has a head part which presses the first plate-like member 21_1 toward the third plate-like member 21_3. Note that details and an effect, brought about by the method in accordance with the second embodiment in which the plate-like members 21_1 through 21_3 are fastened together with use of a bolt, are similar to those of the method in accordance with the first embodiment. As such, a description thereof is omitted here.

(Effect of Coupling Mechanism)

With the configuration of the coupling mechanism 2, heat generated by the heat generating element 92 is transferred to the second plate-like member 21_2 via the second support 23_2. The heat, which has been transferred to the second plate-like member 21_2, is then transferred to each of the first plate-like member 21_1 and the third plate-like member 21_3 via a region in which the second plate-like member 21_2 is in plane contact with each of the first plate-like member 21_1 and the third plate-like member 21_3. The heat, which has been transferred to each of the first plate-like member 21_1 and the third plate-like member 21_3, is subsequently transferred to the radiator 91 via the first support 23_1. The heat, which has been transferred to the radiator 91, is then dissipated into, for example, ambient air. Note that the second plate-like member 21_2 is in plane contact with each of the first plate-like member 21_1 and the third plate-like member 21_3. With the configuration, a thermal resistance of the coupling mechanism 1, which is located between the heat generating element 92 and the radiator 91, can be further reduced as compared with a configuration in which the second plate-like member 21_2 is in point contact or in line contact with each of the first plate-like member 21_1 and the third plate-like member 21_3. As such, heat generated by the heat generating element 92 can be more efficiently dissipated, as compared with a case where the second plate-like member 21_2 is in point contact or in line contact with each of the first plate-like member 21_1 and the third plate-like member 21_3.

A comparison, between (i) the coupling mechanism 1 in accordance with the first embodiment and (ii) the coupling mechanism 2 in accordance with the second embodiment, makes it possible to say the following. Specifically, in the coupling mechanism 1 in accordance with the first embodiment, a heat radiation path from the second support 13_2 to the first support 13_1 is constituted by (i) the plate-like member 11_2, which is a single plate-like member and is joined to the second support 13_2 and (ii) the plate-like member 11_1, which is a single plate-like member and is joined to the first support 13_1. In contrast, in the coupling mechanism 2 in accordance with the second embodiment, a heat radiation path from the second support 23_2 to the first support 23_1 is constituted by (i) the plate-like member 21_2, which is a single plate-like member and is joined to the second support 23_2 and (ii) the plate-like members 21_1 and 21_3, which are two plate-like members and are each joined to the first support 23_1. As such, the coupling mechanism 2 in accordance with the second embodiment has a smaller thermal resistance than the coupling mechanism 1 in accordance with the first embodiment. Thus, as compared with the coupling mechanism 1 in accordance with the first embodiment, the coupling mechanism 2 in accordance with the second embodiment allows for more efficient dissipation of heat generated by the heat generating element 92.

(Variation of Plate-Like Member)

According to the second embodiment, the plate-like members 21_1 through 21_3 are each a plate-like member which has a flat front surface and a flat back surface. Note, however, that the plate-like members 21_1 through 21_3 are each not limited to such a plate-like member.

For example, irregularities, which are complementary to each other, can be provided in respective of (i) a region of the back surface of the first plate-like member 21_1 in which region the back surface of the first plate-like member 21_1 is in plane contact with the front surface of the second plate-like member 21_2 and (ii) a region of the front surface of the second plate-like member 21_2 in which region the front surface of the second plate-like member 21_2 is in plane contact with the back surface of the first plate-like member 21_1. Note, in this case, that the first plate-like member 21_1 and the second plate-like member 21_2 are provided so that irregularities, which are provided on the back surface of the first plate-like member 21_1, mesh with irregularities which are provided on the front surface of the second plate-like member 21_2. This causes an increase in area of a region in which the back surface of the first plate-like member 21_1 is in plane contact with the front surface of the second plate-like member 21_2. This ultimately causes a reduction in thermal resistance between the first plate-like member 21_1 and the second plate-like member 21_2.

Similarly, irregularities, which are complementary to each other, can be provided in respective of (i) a region of the back surface of the second plate-like member 21_2 in which region the back surface of the second plate-like member 21_2 is in plane contact with the front surface of the third plate-like member 21_3 and (ii) a region of the front surface of the third plate-like member 21_3 in which region the front surface of the third plate-like member 21_3 is in plane contact with the back surface of the second plate-like member 21_2. Note, in this case, that the second plate-like member 21_2 and the third plate-like member 21_3 are provided so that irregularities, which are provided on the back surface of the second plate-like member 21_2, mesh with irregularities which are provided on the front surface of the third plate-like member 21_3. This causes an increase in area of a region in which the back surface of the second plate-like member 21_2 is in plane contact with the front surface of the third plate-like member 21_3. This ultimately causes a reduction in thermal resistance between the second plate-like member 21_2 and the third plate-like member 21_3.

Note that a specific example of irregularities, which are provided on the front surface and/or the back surface of each of the plate-like members 21_1 through 21_3, is as has been described with reference to FIG. 3. As such, a description thereof is omitted here. Such irregularities only need to be provided in a partial region of main surfaces of at least one set of plate-like members of the plate-like member group 21. The main surfaces are in plane contact with each other. Specifically, such irregularities can be provided (i) only in a partial region of the back surface of the first plate-like member 21_1 and the front surface of the second plate-like member 21_2 or (ii) only in a partial region of the back surface of the second plate-like member 21_2 and the front surface of the third plate-like member 21_3.

(Variation of Plate-Like Member Group)

According to the second embodiment, a plate-like member group is employed as the plate-like member group 21. The plate-like member group is composed of (i) the plate-like members 21_1 and 21_3 which are two plate-like members and are each joined to the radiator 91 and (ii) the plate-like member 21_2 which is a single plate-like member and is joined to the heat generating element 92. Note, however, that the plate-like member group 21 is not limited to such a plate-like member group.

For example, a plate-like member group can be alternatively employed as the plate-like member group 21. The plate-like member group is composed of (i) the plate-like member 21_2 which is a single plate-like member and is joined to the radiator 91 and (ii) the plate-like members 21_1 and 21_3 which are two plate-like members and are each joined to the heat generating element 92. With the configuration, heat generated by the heat generating element 92 is transferred to each of the first plate-like member 21_1 and the third plate-like member 21_3 via the second support 23_2. The heat thus generated is then transferred to the second plate-like member 21_2 via a region in which the first plate-like member 21_1 and the third plate-like member 21_3 are each in plane contact with the second plate-like member 21_2. The heat, which has been transferred to the second plate-like member 21_2, is subsequently transferred to the radiator 91 via the first support 23_1. The heat, which has been transferred to the radiator 91, is then dissipated into, for example, ambient air.

Even in a case where such a plate-like member group is employed as the plate-like member group 21, heat generated by the heat generating element 92 can be more efficiently dissipated, as compared with a case where the second plate-like member 21_2 is in point contact or in line contact with each of the first plate-like member 21_1 and the third plate-like member 21_3. Furthermore, as compared with the coupling mechanism 1 in accordance with the first embodiment, the coupling mechanism 2 in accordance with the second embodiment allows for more efficient dissipation of heat generated by the heat generating element 92.

(Variation of Fastening Method)

According to the second embodiment, the plate-like members 21_1 through 21_3 are fastened together by a method in which a single bolt, which functions as the shaft member 22, is employed. Note, however, that a method of fastening the plate-like members 21_1 through 21_3 together is not limited to the above method.

Figure 5:
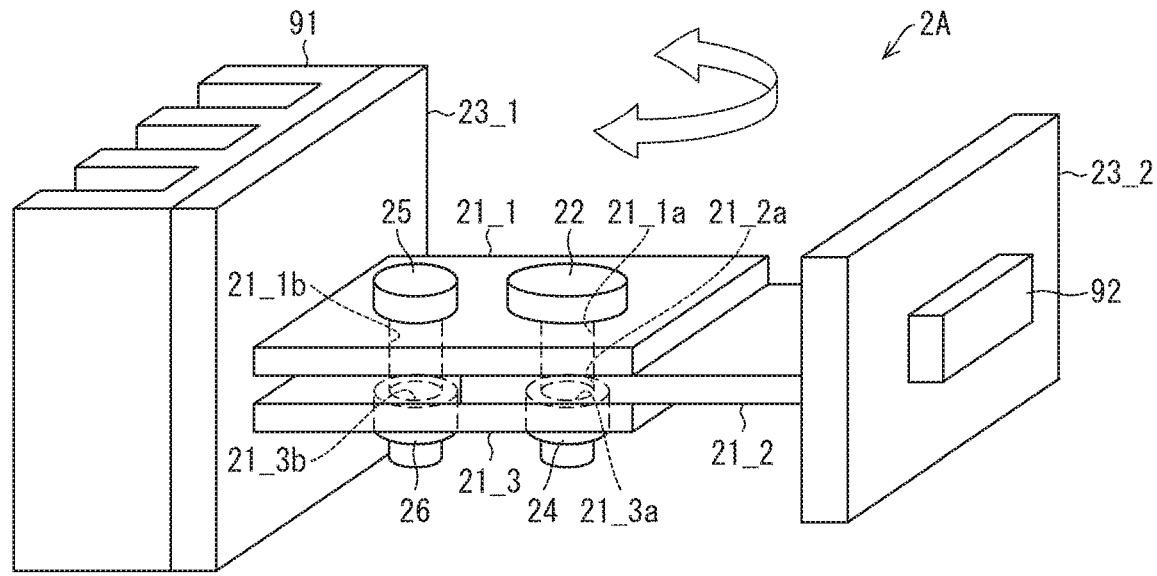
FIG. 5 is a perspective view illustrating a variation of the coupling mechanism illustrated in FIG. 4.

A variation of the method of fastening the plate-like members 21_1 through 21_3 together is described below with reference to FIG. 5. FIG. 5 is a perspective view of a coupling mechanism 2A in which the plate-like members 21_1 through 21_3 are fastened together by a fastening method in accordance with the present variation.

According to the fastening method in accordance with the present variation, the plate-like members 21_1 through 21_3 are fastened together with use of not only a bolt which functions as the shaft member 22 but also a bolt 25 which functions as a coupling member (see FIG. 5). The first plate-like member 21_1 and the third plate-like member 21_3 are coupled together via the bolt 25 in a region in which neither the first plate-like member 21_1 nor the third plate-like member 21_3 is in plane contact with the second plate-like member 21_2.

In a case where the present fastening method is applied, (1) two through holes 21_1a and 21_1b, each of which extends from the front surface of the first plate-like member 21_1 to the back surface of the first plate-like member 21_1, is formed in the first plate-like member 21_1, (2) a single through hole 21_2a, which extends from the front surface of the second plate-like member 21_2 to the back surface of the second plate-like member 21_2, is formed in the second plate-like member 21_2, and (3) two through holes 21_3a and 21_3b, each of which extends from the front surface of the third plate-like member 21_3 to the back surface of the third plate-like member 21_3, is formed in the third plate-like member 21_3. Then, the three plate-like members 21_1 through 21_3 are provided so that (i) the through hole 21_1a, the through hole 21_2a, and the through hole 21_3a communicate with each other and (ii) the through hole 21_1b and the through hole 21_3b coincide with each other. Subsequently, the bolt, which functions as the shaft member 22, is put in the through hole 21_1a, the through hole 21_2a, and the through hole 21_3a, from the front surface side of the first plate-like member 21_1, so as to pass through the through holes 21_1a, 21_2a, and 21_3a. Thereafter, a tip of the bolt, which functions as the shaft member 22, is screwed into a nut 24 which is provided on the back surface side of the third plate-like member 21_3. Next, the bolt 25, which functions as the coupling member, is put in the through hole 21_1b and the through hole 21_3b, from the front surface side of the first plate-like member 21_1, so as to pass through the through hole 21_1b and the through hole 21_3b. Thereafter, a tip of the bolt 25, which functions as the coupling member, is screwed into a nut 26 which is provided on the back surface side of the third plate-like member 21_3. This completes fastening of the plate-like members 21_1 through 21_3.

According to the fastening method in accordance with the present variation, not only a head part of the bolt which functions as the shaft member 22 but also a head part of the bolt 25 which functions as the coupling member presses the first plate-like member 21_1 toward the third plate-like member 21_3. This allows, more reliably, (i) the back surface of the first plate-like member 21_1 to be in plane contact with the front surface of the second plate-like member 21_2 and (ii) the back surface of the second plate-like member 21_2 to be in plane contact with the front surface of the third plate-like member 21_3. This ultimately allows a more reliable reduction in thermal resistance of the coupling mechanism 2A.

Note that an elastic member such as a spring washer can be sandwiched, while being in an elastically contracted state, between the head part of the bolt 25 and the first plate-like member 21_1. Note also that an elastic member such as a spring washer can be sandwiched, while being in an elastically contracted state, between the third plate-like member 21_3 and the nut 26. Furthermore, it is possible to employ a configuration in which (i) the third plate-like member 21_3 has a screw hole instead of the third plate-like member 21_3 having the through hole 21_3b and (ii) the tip of the shaft part of the bolt 25 is screwed into the screw hole instead of the nut 26. Note that the screw hole of the third plate-like member 21_3 can be (i) a through hole which extends from the front surface of the third plate-like member 21_3 to the back surface of the third plate-like member 21_3 or (ii) a non-through-hole which extends from the front surface of the third plate-like member 21_3 to an inner part of the third plate-like member 21_3.

Third Embodiment of Coupling Mechanism

Figure 6:
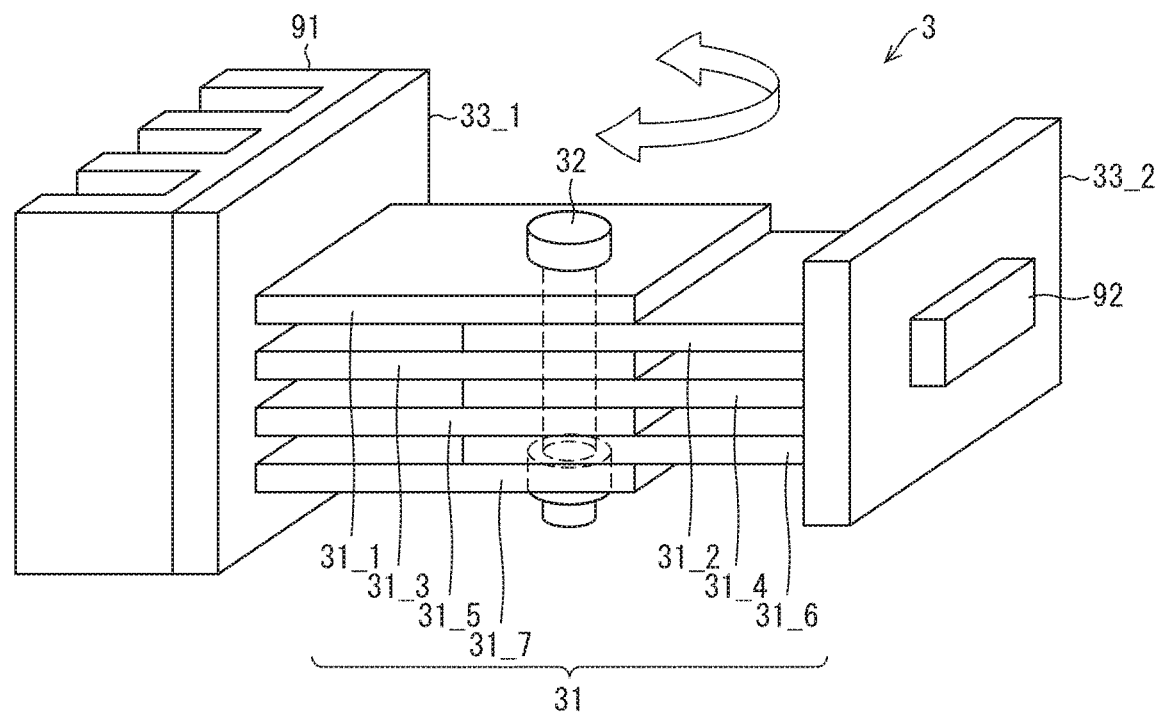
FIG. 6 is a perspective view illustrating a third embodiment of a coupling mechanism in accordance with the present invention.

A third embodiment of a coupling mechanism in accordance with the present invention is described below with reference to FIG. 6. FIG. 6 is a perspective view illustrating a configuration of a coupling mechanism 3 in accordance with the third embodiment.

The coupling mechanism 3 is a mechanism configured to couple a radiator 91 and a heat generating element 92 together. As illustrated in FIG. 6, the coupling mechanism 3 is configured to include a plate-like member group 31, a shaft member 32, and first and second supports 33_1 and 33_2.

According to the third embodiment, the plate-like member group 31 is constituted by first through nth plate-like members 31_1 through 31_n. Note here that n is a natural number which is not less than 4. Of the n plate-like members 31_1 through 31_n, odd-numbered plate-like members 31_1, 31_3, 31_5, . . . are each joined to the radiator 91 via the first support 33_1. The plate-like members 31_1, 31_3, 31_5, . . . and the first support 31_1 are each made of a thermally conductive material. This causes each of the plate-like members 31_1, 31_3, 31_5, . . . to be in thermal contact with the radiator 91 via the first support 33_1. In contrast, of the n plate-like members 31_1 through 31_n, even-numbered plate-like members 31_2, 31_4, 31_6, . . . are each joined to the heat generating element 92 via the second support 33_2. The plate-like members 31_2, 31_4, 31_6, . . . and the second support 33_2 are each made of a thermally conductive material. This causes each of the plate-like members 31_2, 31_4, 31_6, . . . to be in thermal contact with the heat generating element 92 via the second support 23_2. The plate-like members 31_1 through 31_n and the supports 33_1 and 33_2 are each suitably made of, for example, aluminum, an aluminum alloy, copper, or a copper alloy. FIG. 6 illustrates, as an example, a configuration in which n=7. Note, however, that the third embodiment is not limited to such a configuration.

The plate-like members 31_1 through 31_n are alternately provided in this order. Specifically, (i) the plate-like members 31_1, 31_3, 31_5, . . . each of which is joined to the radiator 91 and (ii) the plate-like members 31_2, 31_4, 31_6, . . . each of which is joined to the heat generating element 92 are alternately provided. Note that (i) a partial region of a back surface of a plate-like member (e.g., the plate-like member 31_1) which is joined to the radiator 91 is in plane contact with (ii) a partial region of a front surface of a plate-like member (e.g., the plate-like member 31_2) which is joined to the heat generating element 92. Furthermore, (i) a partial region of a back surface of the plate-like member (e.g., the plate-like member 31_2) which is joined to the heat generating element 92 is in plane contact with (ii) a partial region of a front surface of a plate-like member (e.g., the plate-like member 31_3) which is joined to the radiator 91. Note that the back surface of the plate-like member which is joined to the radiator 91 and the front surface of the plate-like member which is joined to the heat generating element 92 can be (a) in direct plane contact with each other or (b) in indirect plane contact with each other via, for example, heat radiating grease. Note that the back surface of the plate-like member which is joined to the heat generating element 92 and the front surface of the plate-like member which is joined to the radiator 91 can be (a) in direct plane contact with each other or (b) in indirect plane contact with each other via, for example, heat radiating grease.

The shaft member 32 holds the plate-like members 31_1 through 31_n so as to allow the plate-like members 31_1 through 31_n to rotate on a shared axis which is orthogonal to each of main surfaces of the respective plate-like members 31_1 through 31_n, while (i) causing (a) the partial region of the back surface of the plate-like member which is jointed to the radiator 91 to be in plane contact with (b) the partial region of the front surface of the plate-like member which is jointed to the heat generating element 92 and (ii) causing (c) the partial region of the back surface of the plate-like member which is jointed to the heat generating element 92 to be in plane contact with (d) the partial region of the front surface of the plate-like member which is jointed to the radiator 91 into surface. In the third embodiment, a bolt is employed as the shaft member 32. The bolt fastens the plate-like members 31_1 through 31_n. The bolt has a head part which presses the first plate-like member 31_1 toward the nth plate-like member 31_n. Note that details and an effect, brought about by the method in accordance with the third embodiment in which the plate-like members 31_1 through 31_n are fastened together with use of a bolt, are similar to those of the method in accordance with the first embodiment. As such, a description thereof is omitted here.

(Effect of Coupling Mechanism)

With the configuration of the coupling mechanism 3, heat generated by the heat generating element 92 is transferred to the even-numbered plate-like members 31_2, 31_4, 31_6, . . . via the second support 33_2. The heat, which has been transferred to the even-numbered plate-like members 31_2, 31_4, 31_6, . . . , is then transferred to the odd-numbered plate-like members 31_1, 31_3, 31_5, . . . via a region in which the even-numbered plate-like members 31_2, 31_4, 31_6, . . . are in plane contact with the odd-numbered plate-like members 31_1, 31_3, 31_5, . . . . The heat, which has been transferred to the odd-numbered plate-like members 31_1, 31_3, 31_5, . . . , is subsequently transferred to the radiator 91 via the first support 33_1. The heat, which has been transferred to the radiator 91, is then dissipated into, for example, ambient air. Note that the even-numbered plate-like members 31_2, 31_4, 31_6, . . . are in plane contact with the odd-numbered plate-like members 31_1, 31_3, 31_5, . . . . With the configuration, a thermal resistance of the coupling mechanism 1, which is located between the heat generating element 92 and the radiator 91, can be further reduced as compared with a configuration in which the even-numbered plate-like members 31_2, 31_4, 31_6, . . . are in point contact or in line contact with the odd-numbered plate-like members 31_1, 31_3, 31_5, . . . . As such, heat generated by the heat generating element 92 can be more efficiently dissipated, as compared with a case where the even-numbered plate-like members 31_2, 31_4, 31_6, . . . are in point contact or in line contact with the odd-numbered plate-like members 31_1, 31_3, 31_5, . . . .

A comparison, between (i) the coupling mechanism 2 in accordance with the second embodiment and (ii) the coupling mechanism 3 in accordance with the third embodiment, makes it possible to say the following. Specifically, in the coupling mechanism 1 in accordance with the second embodiment, a heat radiation path from the second support 23_2 to the first support 23_1 is constituted by (i) the plate-like member 21_2, which is a single plate-like member and is joined to the second support 23_2 and (ii) the plate-like members 21_1 and 21_3, which are two plate-like members and are each joined to the first support 23_1. In contrast, in the coupling mechanism 3 in accordance with the third embodiment, a heat radiation path from the second support 33_2 to the first support 33_1 is constituted by (i) the plate-like members 31_2, 31_4, 31_6, . . . , which are two or more plate-like members and are each joined to the second support 33_2 and (ii) the plate-like members 31_1, 31_3, 31_5, . . . , which are two or more plate-like members and are each joined to the first support 33_1. As such, the coupling mechanism 3 in accordance with the third embodiment has a smaller thermal resistance than the coupling mechanism 2 in accordance with the second embodiment. Thus, as compared with the coupling mechanism 2 in accordance with the second embodiment, the coupling mechanism 3 in accordance with the third embodiment allows for more efficient dissipation of heat generated by the heat generating element 92.

(Variation of Plate-Like Member)

According to the third embodiment, the plate-like members 31_1 through 31_n are each a plate-like member which has a flat front surface and a flat back surface. Note, however, that the plate-like members 31_1 through 31_n are each not limited to such a plate-like member.

For example, irregularities, which are complementary to each other, can be provided in respective of (1) a region of the back surface of the plate-like member (e.g., the plate-like member 31_1), which is joined to the radiator 91, in which region the back surface of the plate-like member which is joined to the radiator 91 is in plane contact with the front surface of the plate-like member (e.g., the plate-like member 31_2) which is joined to the heat generating element 92 and (2) a region of the front surface of the plate-like member, which is joined to the heat generating element 92, in which region the front surface of the plate-like member which is joined to the heat generating element 92 is in plane contact with the back surface of the plate-like member which is jointed to the radiator 91. Note, in this case, that (i) the plate-like member which is joined to the radiator 91 and (ii) the plate-like member which is joined to the heat generating element 92 are provided so that (a) irregularities, which are provided on the back surface of the plate-like member which is joined to the radiator 91, mesh with (b) irregularities which are provided on the front surface of the plate-like member which is joined to the heat generating element 92. This causes an increase in area of a region in which (i) the back surface of the plate-like member which is joined to the radiator 91 is in plane contact with (ii) the front surface of the plate-like member which is joined to the heat generating element 92. This ultimately causes a reduction in thermal resistance between (a) the plate-like member which is joined to the radiator 91 and (b) the plate-like member which is joined to the heat generating element 92.

Similarly, irregularities, which are complementary to each other, can be provided in respective of (1) a region of the back surface of the plate-like member (e.g., the plate-like member 31_2), which is joined to the heat generating element 92, in which region the back surface of the plate-like member which is joined to the heat generating element 92 is in plane contact with the front surface of the plate-like member (e.g., the plate-like member 31_3) which is joined to the radiator 91 and (2) a region of the front surface of the plate-like member, which is joined to the radiator 91, in which region the front surface of the plate-like member which is joined to the radiator 91 is in plane contact with the back surface of the plate-like member which is jointed to the heat generating element 92. Note, in this case, that (i) the plate-like member which is joined to the heat generating element 92 and (ii) the plate-like member which is joined to the radiator 91 are provided so that (a) irregularities, which are provided on the back surface of the plate-like member which is joined to the heat generating element 92, mesh with (b) irregularities which are provided on the front surface of the plate-like member which is joined to the radiator 91. This causes an increase in area of a region in which (i) the back surface of the plate-like member which is joined to the heat generating element 92 is in plane contact with (ii) the front surface of the plate-like member which is joined to the radiator 91. This ultimately causes a reduction in thermal resistance between (a) the plate-like member which is joined to the heat generating element 92 and (b) the plate-like member which is joined to the radiator 91.

Note that a specific example of irregularities, which are provided on the front surface and/or the back surface of each of the plate-like members 31_1 through 31_n, is as has been described with reference to FIG. 3. As such, a description thereof is omitted here. Such irregularities only need to be provided in a partial region of main surfaces of at least one set of plate-like members of the plate-like member group 31. The main surfaces are in plane contact with each other.

(Variation of Plate-Like Member Group)

According to the third embodiment, a plate-like member group is employed as the plate-like member group 31. Such a plate-like member group is composed of (i) the odd-numbered plate-like members 31_1, 31_3, 31_5, . . . each of which is joined to the radiator 91 and (ii) the even-numbered plate-like members 31_2, 31_4, 31_6, . . . each of which is joined to the heat generating element 92. Note, however, that the plate-like member group 31 is not limited to such a plate-like member group.

For example, a plate-like member group can be alternatively employed as the plate-like member group 31. The plate-like member group is composed of (i) the even-numbered plate-like members 31_2, 31_4, 31_6, . . . each of which is joined to the radiator 91 and (ii) the odd-numbered plate-like members 31_1, 31_3, 31_5, . . . each of which is joined to the heat generating element 92. With the configuration, heat generated by the heat generating element 92 is transferred to the odd-numbered plate-like members 31_1, 31_3, 31_5, . . . via the second support 33_2. The heat thus generated is then transferred to the even-numbered plate-like members 31_2, 31_4, 31_6, . . . via a region in which the odd-numbered plate-like members 31_1, 31_3, 31_5, . . . are in plane contact with the even-numbered plate-like members 31_2, 31_4, 31_6, . . . . The heat, which has been transferred to the even-numbered plate-like members 31_2, 31_4, 31_6, . . . , is subsequently transferred to the radiator 91 via the first support 33_1. The heat, which has been transferred to the radiator 91, is then dissipated into, for example, ambient air.

Even in a case where such a plate-like member group is employed as the plate-like member group 31, heat generated by the heat generating element 92 can be more efficiently dissipated, as compared with a case where the odd-numbered plate-like members 31_1, 31_3, 31_5, . . . are in point contact or in line contact with the even-numbered plate-like members 31_2, 31_4, 31_6, . . . . Furthermore, as compared with the coupling mechanism 1 in accordance with the second embodiment, the coupling mechanism 3 in accordance with the third embodiment allows for more efficient dissipation of heat generated by the heat generating element 92.

Embodiment of Coupling Mechanism Group

Figure 7:
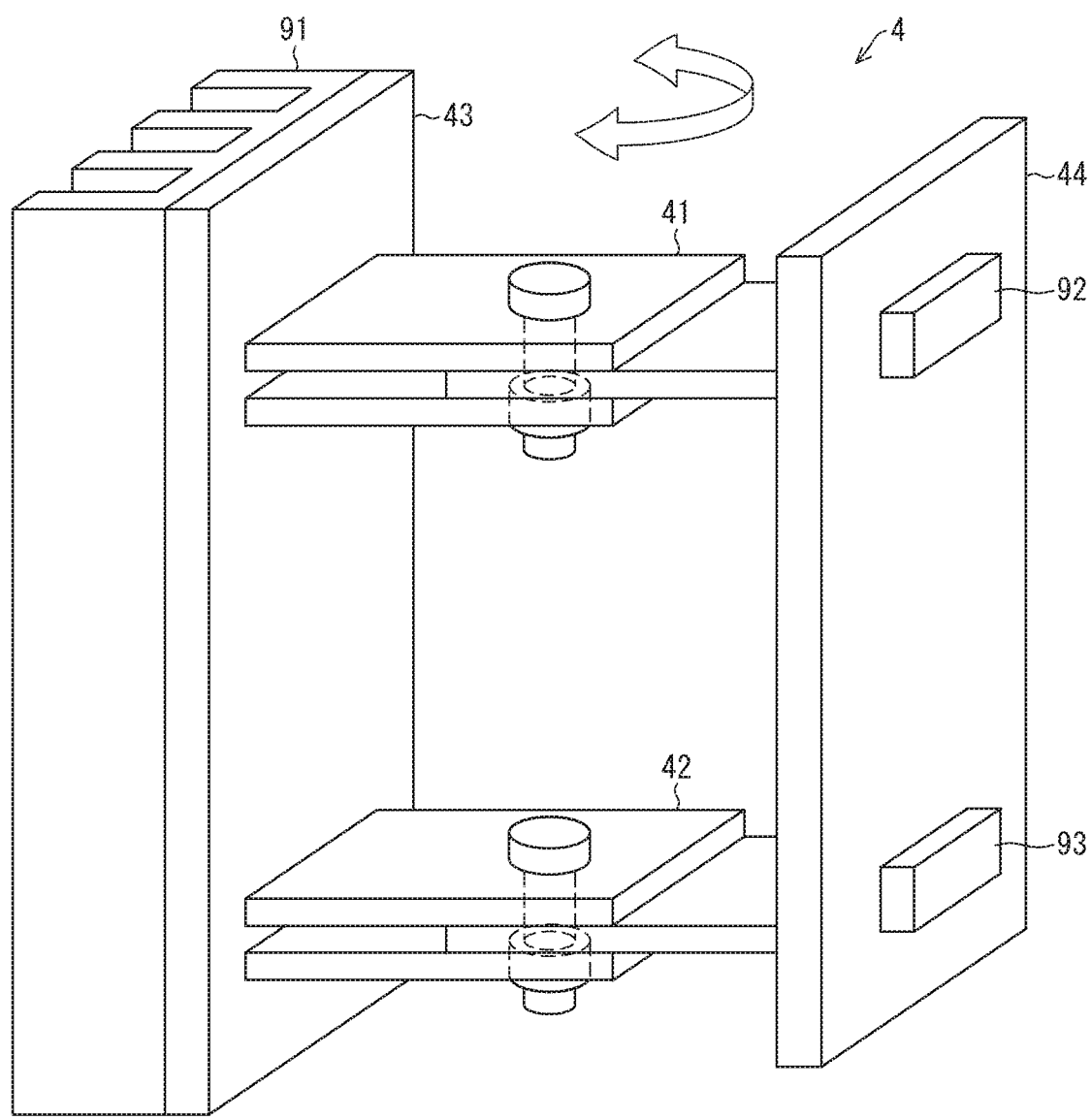
FIG. 7 is a perspective view illustrating an embodiment of a coupling mechanism group in accordance with the present invention.

An embodiment of a coupling mechanism group in accordance with the present invention is described below with reference to FIG. 7. FIG. 7 is a perspective view illustrating a configuration of a coupling mechanism group 4 in accordance with the present embodiment.

The coupling mechanism group 4 is a mechanism configured to couple a radiator 91 and first and second heat generating elements 92 and 93 together. As illustrated in FIG. 7, the coupling mechanism group 4 is configured to include first and second coupling mechanisms 41 and 42.

The first coupling mechanism 41 and the second coupling mechanism are each configured as in the case of the coupling mechanism 2 in accordance with the second embodiment. Note, however, that the first coupling mechanism 41 and the second coupling mechanism 42 have respective first supports which are achieved in a form of a shared first support 43. The first supports each correspond to the first support 23_1 of the coupling mechanism 2. Similarly, the first coupling mechanism 41 and the second coupling mechanism 42 have respective second supports which are achieved in a form of a shared second support 44. The second supports each correspond to the second support 23_2 of the coupling mechanism 2.

The heat generating elements 92 and 93 are each joined to the shared second support 44. The first heat generating element 92 is provided in a first region of the shared second support 44 in which first region the first coupling mechanism 41 is joined to the shared second support 44. The second heat generating element 93 is provided in a second region of the shared second support 44 in which second region the second coupling mechanism 42 is joined to the shared second support 44. This allows heat generated by the heat generating elements 92 and 93 to be efficiently transferred to the respective coupling mechanisms 41 and 42.

With the configuration of the coupling mechanism group 4, heat generated by the heat generating elements 92 and 93 is transferred to the first coupling mechanism 41 and the second coupling mechanism 42, respectively, via the shared second support 44. The heat, which has been transferred to the first coupling mechanism 41 and the second coupling mechanism 42, is then transferred to the radiator 91 via the shared first support 43. The heat, which has been transferred to the radiator 91, is then dissipated into, for example, ambient air.

A comparison, between (i) the coupling mechanism 2 in accordance with the second embodiment and (ii) the coupling mechanism group 4 in accordance with the present embodiment, makes it possible to say the following. Specifically, in the coupling mechanism 2 in accordance with the second embodiment, a heat radiation path from the second support 23_2 to the first support 23_1 is constituted by (i) the plate-like member 21_2, which is a single plate-like member and is joined to the second support 23_2 and (ii) the plate-like members 21_1 and 21_3, which are two plate-like members and are each joined to the first support 23_1. In contrast, in the coupling mechanism group 4 in accordance with the present embodiment, a heat radiation path from the shared second support 44 to the shared first support 43 is constituted by (i) two plate-like members each of which is joined to the shared second support 44 (each of the two plate-like members corresponds to the plate-like member 21_2 of the coupling mechanism 2) and (ii) four plate-like members each of which is joined to the shared first support 43 (a first pair of two plate-like members and a second pair of two plate-like members correspond to the respective plate-like members 21_1 and 21_3 of the coupling mechanism 2). As such, the coupling mechanism group 4 in accordance with the present embodiment has a smaller thermal resistance than the coupling mechanism in accordance with the second embodiment. Thus, as compared with the coupling mechanism 2 in accordance with the second embodiment, the coupling mechanism group 4 in accordance with the present embodiment allows for more efficient dissipation, into, for example, ambient air, of heat generated by the heat generating elements 92 and 93.

The present embodiment has described the coupling mechanism group 4 which is configured to include the two coupling mechanisms 41 and 42. Note, however, that a configuration of the coupling mechanism group 4 is not limited to such a configuration. Specifically, the coupling mechanism group 4 can be alternatively configured to include three or more coupling mechanisms. The present embodiment has also described the coupling mechanism group 4 which is configured to include the two coupling mechanisms 41 and 42 each of which is configured as in the case of the coupling mechanism 2 in accordance with the second embodiment. Note, however, that a configuration of the coupling mechanism group 4 is not limited to such a configuration. The coupling mechanism group 4 can be alternatively configured to include coupling mechanisms each of which is (i) configured as in the case of the coupling mechanism 1 in accordance with the first embodiment or (ii) configured as in the case of the coupling mechanism 3 in accordance with the third embodiment. Alternatively, the coupling mechanism group 4 can be configured to include coupling mechanisms which are different in configuration. For example, the coupling mechanism group 4 can be configured to include (i) a coupling mechanism which is configured as in the case of the coupling mechanism 1 in accordance with the first embodiment and (ii) a coupling mechanism which is configured as in the case of the coupling mechanism 2 in accordance with the second embodiment.

Application Example

For example, the coupling mechanisms 1 through 3 (described earlier) and the coupling mechanism group 4 (described earlier) are each suitable to be used to rotatably hold an antenna substrate in an antenna device.

Figure 8:
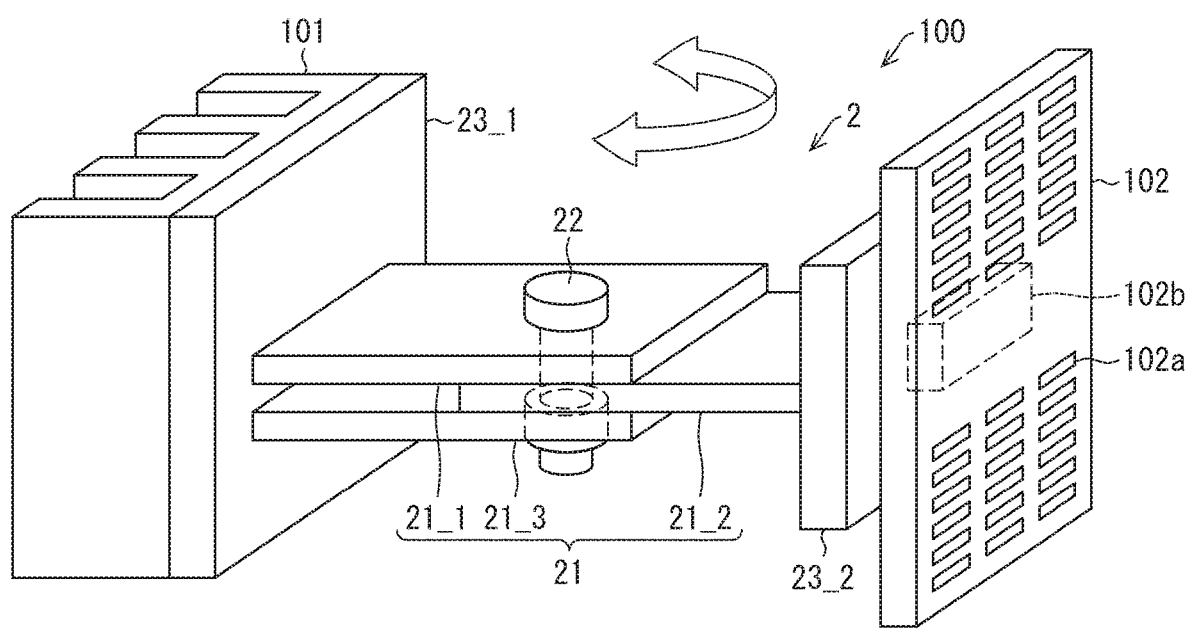
FIG. 8 is a perspective view illustrating an application example of the coupling mechanism illustrated in FIG. 1.

Such an antenna device 100 is described below with reference to FIG. 8. FIG. 8 is a perspective view illustrating a configuration of the antenna device 100.

The antenna device 100 is configured to include not only the coupling mechanism 2 but also a heat sink 101 and an antenna substrate 102. The antenna substrate 102 is configured to include (i) antenna elements 102*a* (an example of an "antenna" recited in Claims) and (ii) at least one integrated circuit 102*b*. The antenna elements 102*a* and the at least one integrated circuit 102*b* are mounted on one and the other, respectively, of main surfaces of the antenna substrate 102. Note that the antenna elements 102*a* and the at least one integrated circuit 102*b* are connected via wires (not illustrated). The at least one integrated circuit 102*b* generates heat as the at least one integrated circuit 102*b* operates. Thus, the antenna substrate 102 which is configured to include the at least one integrated circuit 102*b* corresponds to a heat generating element.

The first plate-like member 21_1 and the third plate-like member 21_3 of the coupling mechanism 2 are each joined to the heat sink 101 via the first support 23_1. The second plate-like member 21_2 of the coupling mechanism 2 is joined to the antenna substrate 102 via the second support 23_2. The antenna substrate 102 and the second support 23_2 are preferably joined together by causing a surface of the at least one integrated circuit 102*b* to be in plane contact with a surface of the second support 23_2 (see FIG. 8).

A configuration of the antenna substrate 102 is not limited to the above configuration. For example, the antenna elements 102*a* can be configured in any of (i) a region of one of the main surfaces of the antenna substrate 102 (a main surface on which no integrated circuit 102*b* is mounted), (ii) a region of the other one of the main surfaces of the antenna substrate 102 (a main surface on which the at least one integrated circuit 102*b* is mounted), and (iii) a region of an inner layer of the antenna substrate 102. Alternatively, the antenna elements 102*a* can be provided so as to extend over two or more of the above three regions (i) through (iii). Further alternatively, the antenna elements 102*a* and the at least one integrated circuit 102*b* can be provided so as to be close to or spaced from each other. In a case where the antenna elements 102*a* and the at least one integrated circuit 102*b* are provided on a single main surface of the antenna substrate 102, the at least one integrated circuit 102*b* which generates heat in a larger amount than the antenna elements 102*a* is preferably provided so as to be closer to the plate-like member 21_2 of the coupling mechanism 2.

In the antenna device 100, the antenna substrate 102 is fixed to the heat sink 101 via the coupling mechanism 2. The configuration allows an orientation of the antenna substrate 102 to be controlled by causing the second plate-like member 21_2 to rotate with respect to each of the first plate-like member 21_1 and the third plate-like member 21_3. Furthermore, in the antenna device 100, the antenna substrate 102 is in thermal contact with the heat sink 101 via the coupling mechanism 2. The configuration allows for more efficient dissipation of heat generated by the antenna substrate 102.

The present application example has described the antenna device 100 which is configured to include the coupling mechanism 2 in accordance with the second embodiment. Note, however, that instead of including the coupling mechanism 2 in accordance with the second embodiment, the antenna device 100 can be alternatively configured to include (i) the coupling mechanism 1 in accordance with the first embodiment, (ii) the coupling mechanism 3 in accordance with the third embodiment, or (iii) the coupling mechanism group 4 which is configured to include any combination of the coupling mechanism 1, the coupling mechanism 2, and the coupling mechanism 3.

Aspects of the present invention can also be expressed as follows:

A coupling mechanism (1, 2, 2A, 3) in accordance with an embodiment of the present invention includes: a plate-like member group (11, 21, 31) including (i) a first plate-like member (11_2, 21_2, 31_2, 31_4, 31_6) which is joined to a heat generating element (92) and (ii) a second plate-like member (11_1, 21_1, 21_3, 31_1, 31_3, 31_5, 31_7) which is joined to a radiator (91); and a shaft member (12, 22, 32) configured to hold the first plate-like member and the second plate-like member so as to allow the first plate-like member and the second plate-like member (11_1, 11_2, 21_1, 21_2, 21_3, 31_1, 31_2, 31_3, 31_4, 31_5, 31_6, 31_7) to rotate on a shared axis which is orthogonal to main surfaces of the respective first and second plate-like members (11_1, 11_2, 21_1, 21_2, 21_3, 31_1, 31_2, 31_3, 31_4, 31_5, 31_6, 31_7), while causing a partial region of the main surface of the first plate-like member (11_2, 21_2, 31_2, 31_4, 31_6) to be in plane contact with a partial region of the main surface of the second plate-like member (11_1, 21_1, 21_3, 31_1, 31_3, 31_5, 31_7).

With the configuration, a thermal resistance of a coupling mechanism can be further reduced as compared with a case where a plate-like member which is joined to a heat generating element are in point contact or in line contact with a plate-like member which is joined to a radiator. As such, a coupling mechanism thus configured allows for more efficient dissipation of heat generated by a heat generating element, as compared with a conventional coupling mechanism.

The coupling mechanism (1) in accordance with an embodiment of the present invention is preferably configured such that the first plate-like member is a single plate-like member (11_2), and the second plate-like member is a single plate-like member (11_1).

A coupling mechanism thus configured makes it possible to achieve, by a simple configuration, a coupling mechanism which allows for more efficient dissipation of heat generated by a heat generating element, as compared with a conventional coupling mechanism.

The coupling mechanism (2, 2A) in accordance with an embodiment of the present invention is preferably configured such that: (i) the first plate-like member is a single plate-like member (21_2), the second plate-like member includes two plate-like members (21_1, 21_3), and the single plate-like member (21_2) is provided between the two plate-like members (21_1, 21_3) so as to be opposite to the two plate-like members (21_1, 21_3); or (ii) the second plate-like member is a single plate-like member, the first plate-like member includes two plate-like members, and the single plate-like member is provided between the two plate-like members so as to be opposite to the two plate-like members.

With the configuration, a thermal resistance of a coupling mechanism can be further reduced. This allows for more efficient dissipation of heat generated by a heat generating element.

A coupling mechanism (2A) in accordance with an embodiment of the present invention is preferably configured to further include a coupling member (25) configured to couple the two plate-like members (21_1, 21_3) together in a region in which the two plate-like members (21_1, 21_3) are not in plane contact with the single plate-like member (21_2) so that the coupling member (25) causes one (21_1) of the two plate-like members (21_1, 21_3) to press the other one (21_3) of the two plate-like members.

With the configuration, a thermal resistance of a coupling mechanism can be further reduced. This allows for more efficient dissipation of heat generated by a heat generating element.

The coupling mechanism (3) in accordance with an embodiment of the present invention is preferably configured such that: the first plate-like member includes two or more first plate-like members (31_2, 31_4, 31_6) and (ii) the second plate-like member includes two or more second plate-like members (31_1, 31_3, 31_5, 31_7); and the first plate-like member (31_2, 31_4, 31_6) and the one second plate-like member (31_1, 31_3, 31_5, 31_7) are alternately provided.

With the configuration, a thermal resistance of a coupling mechanism can be further reduced. This allows for more efficient dissipation of heat generated by a heat generating element.

The coupling mechanism (1, 2, 2A, 3) in accordance with an embodiment of the present invention is preferably configured such that the shaft member (12, 22, 32) presses one (11_1, 21_1, 31_1) of two plate-like members (11_1, 11_2, 21_1, 21_3, 31_1, 31_7), which are located on outermost sides of the plate-like member group, toward the other one (11_2, 21_3, 31_7) of the two plate-like members.

The configuration allows the plate-like members to be more reliably in plane contact with each other. This allows for more reliable dissipation of heat generated by a heat generating element.

The coupling mechanism (1, 2, 2A, 3) in accordance with an embodiment of the present invention is preferably configured such that: the shaft member (12, 22, 32) is a bolt (12, 22, 32) including (i) a head part (12a) which is provided on an outside of the one (11_1, 21_1, 31_1) of the two plate-like members and (ii) a shaft part (12b) which passes through the one (11_1, 21_1, 31_1) of the two plate-like members and is screwed into (a) a nut (14, 24) which is provided on an outside of the other one (11_2, 21_3, 31_7) of the two plate-like members or (b) a screw hole which is provided in the other one (11_2, 21_3, 31_7) of the two plate-like members; and an elastically contracted elastic member (15) is sandwiched (i) between the head part (12a) of the bolt (12, 22, 32) and the one (11_1, 21_1, 31_1) of the two plate-like members and/or (ii) between the nut (14, 24) and the other one (11_2, 21_3, 31_7) of the two plate-like members.

The configuration allows the plate-like members to be more stably in plane contact with each other. This allows for more stable dissipation of heat generated by a heat generating element.

The coupling mechanism (1, 2, 2A, 3) in accordance with an embodiment of the present invention is preferably configured such that irregularities, having ridges which radially extend from the shared axis, are provided in a partial region of main surfaces of the plate-like members that are in plane contact with each other.

The configuration causes an increase in area of a region of a main surface of each of the plate-like members in which region the main surface is in plane contact with a main surface of an adjacent plate-like member. This allows for more efficient dissipation of heat generated by a heat generating element. Furthermore, it is possible to gradually rotate the plate-like members.

The coupling mechanism (1, 2, 2A, 3) in accordance with an embodiment of the present invention is preferably configured such that irregularities, having ridges which are concentrically provided around the shared axis, are provided in a partial region of main surfaces of the plate-like members that are in plane contact with each other.

The configuration causes an increase in area of a region of a main surface of each of the plate-like members in which region the main surface is in plane contact with a main surface of an adjacent plate-like member. This allows for more efficient dissipation of heat generated by a heat generating element. Furthermore, it is possible to continuously rotate the plate-like members.

A coupling mechanism group (4) in accordance with an embodiment of the present invention is desirably a coupling mechanism group (4) including: a plurality of coupling mechanisms (41, 42), each of the plurality of coupling mechanisms (41, 42) being a coupling mechanism mentioned above, in the each of the plurality of coupling mechanisms (41, 42), each first plate-like member being joined to a corresponding heat generating element (92, 93) via a shared support (44), in the each of the plurality of coupling mechanisms (41, 42), each second plate-like member being joined to a corresponding radiator (91) via a shared support (43).

With the configuration, a thermal resistance of a coupling mechanism can be further reduced. This allows for more efficient dissipation of heat generated by a heat generating element.

An antenna device (100) in accordance with an embodiment of the present invention includes: a coupling mechanism (1, 2, 3) mentioned above or a coupling mechanism group (4) mentioned above; the heat generating element (92, 93); and the radiator (91), the heat generating element (92, 93) being an antenna substrate (102) including an integrated circuit (102b) and an antenna element (102a).

The configuration makes it possible to achieve an antenna device which allows for more efficient dissipation of heat generated by an antenna substrate, as compared with a conventional antenna device.

Additional Remarks

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST 1, 2, 3, 41, 42 Coupling mechanism
11, 21, 31 Plate-like member group
12, 22, 32 Shaft member
13_1, 23_1, 33_1, 43 First support
13_2, 23_2, 33_2, 44 Second support
4 Coupling mechanism group
91 Radiator
92, 93 Heat generating element
100 Antenna device
101 Heat sink
102 Antenna substrate
102a Antenna element
102b Integrated circuit

The invention claimed is:

1. A coupling mechanism comprising:
a plate-like member group including (i) a first plate-like member which is joined to a heat generating element and (ii) a second plate-like member which is joined to a radiator; and
a shaft member configured to hold the first plate-like member and the second plate-like member so as to allow the first plate-like member and the second plate-like member to rotate on a shared axis which is orthogonal to main surfaces of the respective first and second plate-like members, while causing a partial region of the main surface of the first plate-like member to be in plane contact with a partial region of the main surface of the second plate-like member,
wherein:
(i) the first plate-like member is a single plate-like member, the second plate-like member includes two plate-like members, and the single plate-like member is provided between the two plate-like members so as to be opposite to the two plate-like members; or
(ii) the second plate-like member is a single plate-like member, the first plate-like member includes two plate-like members, and the single plate-like member is provided between the two plate-like members so as to be opposite to the two plate-like members.

2. A coupling mechanism as set forth in claim 1, further comprising
a coupling member configured to couple the two plate-like members together in a region in which the two plate-like members are not in plane contact with the single plate-like member so that the coupling member causes one of the two plate-like members to press the other one of the two plate-like members.

3. A coupling mechanism comprising:
a plate-like member group including (i) a first plate-like member which is joined to a heat generating element and (ii) a second plate-like member which is joined to a radiator; and
a shaft member configured to hold the first plate-like member and the second plate-like member so as to allow the first plate-like member and the second plate-like member to rotate on a shared axis which is orthogonal to main surfaces of the respective first and second plate-like members, while causing a partial region of the main surface of the first plate-like member to be in plane contact with a partial region of the main surface of the second plate-like member,
wherein:
the first plate-like member includes two or more first plate-like members and the second plate-like member includes two or more second plate-like members; and
the first plate-like member and the second plate-like member are alternately provided.

4. The coupling mechanism as set forth in claim 1, wherein the shaft member presses one of two plate-like members, which are located on outermost sides of the plate-like member group, toward the other one of the two plate-like members.

5. The coupling mechanism as set forth in claim 4, wherein:
the shaft member is a bolt including (i) a head part which is provided on an outside of the one of the two plate-like members and (ii) a shaft part which passes through the one of the two plate-like members and is screwed into (a) a nut which is provided on an outside of the other one of the two plate-like members or (b) a screw hole which is provided in the other one of the two plate-like members; and
an elastically contracted elastic member is sandwiched (i) between the head part of the bolt and the one of the two plate-like members and/or (ii) between the nut and the other one of the two plate-like members.

6. The coupling mechanism as set forth in claim 1, wherein
irregularities, having ridges which radially extend from the shared axis, are provided in a partial region of main surfaces of the plate-like members that are in plane contact with each other.

7. The coupling mechanism as set forth in claim 1, wherein
irregularities, having ridges which are concentrically provided around the shared axis, are provided in a partial region of main surfaces of the plate-like members that are in plane contact with each other.

8. A coupling mechanism group comprising:
a plurality of coupling mechanisms,
each of the plurality of coupling mechanisms being a coupling mechanism recited in claim 1,
in said each of the plurality of coupling mechanisms, each first plate-like member being joined to a corresponding heat generating element via a shared support,
in said each of the plurality of coupling mechanisms, each second plate-like member being joined to a corresponding radiator via a shared support.

9. An antenna device comprising:
a coupling mechanism recited in claim 1;
the heat generating element; and
the radiator,
the heat generating element being an antenna substrate including an integrated circuit and an antenna.

10. An antenna device comprising:
a coupling mechanism, the coupling mechanism comprising:
a plate-like member group including (i) a first plate-like member which is joined to a heat generating element and (ii) a second plate-like member which is joined to a radiator, and
a shaft member configured to hold the first plate-like member and the second plate-like member so as to allow the first plate-like member and the second plate-like member to rotate on a shared axis which is orthogonal to main surfaces of the respective first and second plate-like members, while causing a partial region of the main surface of the first plate-like member to be in plane contact with a partial region of the main surface of the second plate-like member;
the heat generating element; and
the radiator,
the heat generating element being an antenna substrate including an integrated circuit and an antenna.

11. The antenna device as set forth in claim 10, wherein the first plate-like member is a single plate-like member, and the second plate-like member is a single plate-like member.

* * * * *